United States Patent [19]

Katsuyama

[11] Patent Number: 4,555,679
[45] Date of Patent: Nov. 26, 1985

[54] DETECTION CIRCUIT FOR DETECTING SYNCHRONOUS AND ASYNCHRONOUS STATES IN A PHASE-LOCKED LOOP CIRCUIT

[75] Inventor: Hitoshi Katsuyama, Saitama, Japan

[73] Assignee: Pioneer Video Corporation, Yamanashi, Japan

[21] Appl. No.: 496,733

[22] Filed: May 20, 1983

[30] Foreign Application Priority Data

May 20, 1982 [JP] Japan .................. 57-85598

[51] Int. Cl.[4] .................. H03L 7/00; H03L 7/10; H04N 9/46
[52] U.S. Cl. .................. 331/17; 331/20; 331/DIG. 2; 358/17; 358/20
[58] Field of Search .................. 331/17, 20, DIG. 2; 358/17, 20

[56] References Cited

U.S. PATENT DOCUMENTS

| | | | |
|---|---|---|---|
| 2,962,666 | 11/1960 | Pollack | 331/20 |
| 3,078,421 | 2/1963 | Heuer et al. | 331/20 |
| 3,796,962 | 3/1974 | Hekimian | 331/DIG. 2 X |
| 3,873,766 | 3/1975 | Maeda | 331/20 X |
| 4,000,476 | 12/1976 | Walker et al. | 331/DIG. 2 X |
| 4,015,287 | 3/1977 | Hovens | 331/20 X |
| 4,232,393 | 11/1980 | Kumaoka et al. | 331/DIG. 2 X |
| 4,426,627 | 1/1984 | Yoshisato et al. | 331/17 X |

Primary Examiner—Eugene R. LaRoche
Assistant Examiner—D. C. Mis
Attorney, Agent, or Firm—Sughrue, Mion, Zinn, Macpeak and Seas

[57] ABSTRACT

The output of a phase comparator in the PLL of the data reproduction unit is filtered to remove low frequency components which may be due to record eccentricity. The filtered output is then rectified and integrated, with the level of the integrated signal determining whether the PLL should be operated in a broad or narrow band state.

14 Claims, 9 Drawing Figures

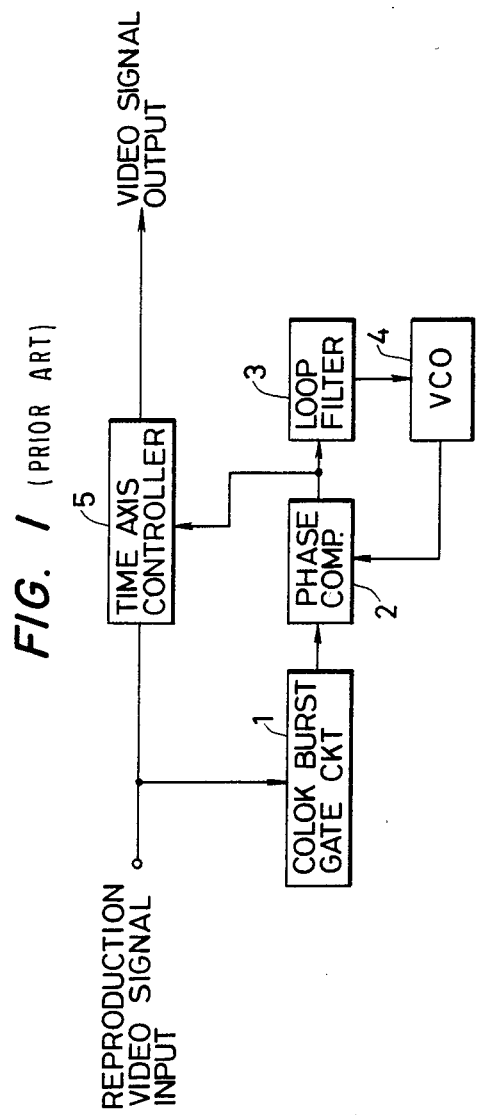
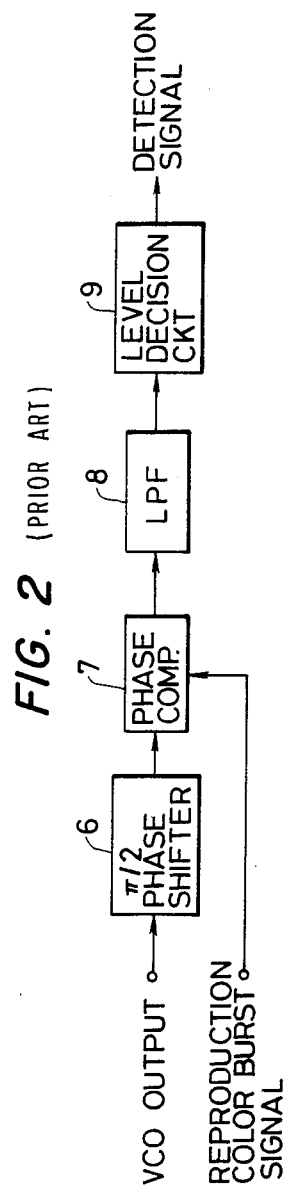

DETECTION CIRCUIT FOR DETECTING SYNCHRONOUS AND ASYNCHRONOUS STATES IN A PHASE-LOCKED LOOP CIRCUIT

BACKGROUND OF THE INVENTION

This invention relates to a circuit for detecting whether a phase-locked loop circuit (hereinafter referred to as "a PLL circuit", when applicable) is in a synchronous state or an asynchronous state, and more particularly to such a detection circuit which is used to detect the time axis error of a reproduction signal in a recorded data reproducing device.

A recorded data reproducing device obtains a stable reproduction signal by using a circuit for detecting and correcting its time axis error. For instance, in a video disk player (VDP) for reproducing a color video signal, a so-called "tangential mirror" is driven by the phase error component of the horizontal synchronizing signal of the reproduction signal, to control the relative positions in the track-tangential direction of the record track and a pickup data detection point. The reproduction video signal obtained in this manner, however, includes a residual phase error. In order to correct this error, a circuit as shown in FIG. 1 is employed.

In FIG. 1, a burst gate circuit 1 extracts the 3.58 MHz color burst signal from a reproduction video signal, and a PLL circuit made up of a phase comparator 2, a loop filter 3 and a voltage-controlled oscillator (VCO) 4 detects the color burst phase. A signal which varies with the variation in phase of the reproduction color burst signal is obtained at the output of the phase comparator 2. As such, the detection output is used to cause a time axis controller 5 to correct the time axis of the reproduction video signal, to thereby compensate for the above-described residual phase error.

When the PLL circuit is in a synchronous state, it is necessary to change the frequency characteristic of the loop to a narrow band characteristic (for instance with a cut-off frequency of 30 Hz) so that it is not affected by high frequency noises or the like. Similarly, when the PLL is in an asynchronous state, it is necessary to change the frequency characteristic to a wide band characteristic (for instance having a cut-off frequency of 500 Hz) so that the lock-in operation is achieved more quickly. In order to meet this requirement, the synchronous state and the asynchronous state of the PLL circuit are detected, and the time constant of the loop filter 3 is changed, so that the loop bandwidth is varied. One example of a circuit for detecting the synchronous and asynchronous states of the PLL circuit is shown in FIG. 2. The output of the VCO 4 is phase-shifted as much as 90° by a $\pi/2$ phase shifter 6, and is compared with a reproduction color burst signal in a phase comparator 7. The comparison output is converted into a DC signal by a low-pass filter (LPF) 8, which is applied to a level decision circuit 9. The level decision output is a synchronous/asynchronous state detection signal which controls the time constant of the loop filter 3.

In the synchronous state, the phase difference between the reproduction color burst signal and the VCO output signal is $\pi/2$. However, with the output of the phase shifter 6 being obtained by phase-shifting the VCO output signal by as much as $\pi/2$, the phase difference between the reproduction color burst signal and the output of the phase shifter 6 is $\pi$. The output signal of the LPF 8, to which the output of the phase comparator 7 is applied, is maintained for instance at a high level. In the asynchronous state, the two inputs to the phase comparator 7 are random, and therefore the output of the LPF 8 is lower in level than in the synchronous state. Accordingly, whether or not the PLL circuit is in the synchronous state can be detected by comparing the output level of the LPF 8 with a predetermined reference level in the level decision unit 9.

However, in a VDP, the record disk is generally somewhat eccentric. Therefore, even in the synchronous state, the color burst signal will include phase error, due to the eccentricity, which has a component lower than 30 Hz (the component being 30 Hz in the case of a constant angular velocity (CAV) record disk system). Accordingly, it is difficult for the detecting circuit in FIG. 2 to accurately detect whether or not the PLL circuit is in the synchronous state.

SUMMARY OF THE INVENTION

Accordingly, an object of this invention is to provide a synchronous/asynchronous state detecting circuit which can stably and accurately detect the synchronous state of a PLL circuit employed in a time axis error detecting device for a VDP or the like.

A specific feature of the PLL circuit synchronous-/asynchronous state detecting circuit according to the invention resides in that a phase comparator in a PLL circuit receives as an input a particular frequency signal (such as a reproduction color burst signal in the case of a color video signal) and the oscillation signal of a VCO and provides an output including a beat component in the synchronous state of the PLL, and a band-pass filter (BPF) or the like extracts a predetermined frequency component which is obtained by removing the beat component from the output of the phase comparator, and the extracted output is used to detect whether the PLL circuit is in a synchronous state or an asynchronous state.

BRIEF DESCRIPTION OF THE DRAWINGS

This invention will be described with reference to the accompanying drawings, in which:

FIG. 1 is a block diagram showing a time axis correcting device in a conventional VDP;

FIG. 2 is a block diagram showing an example of a conventional circuit for detecting the synchronous state of the PLL circuit in FIG. 1;

DETAILED DESCRIPTION OF THE PREFERRED EMBODIMENTS

Figure 3:
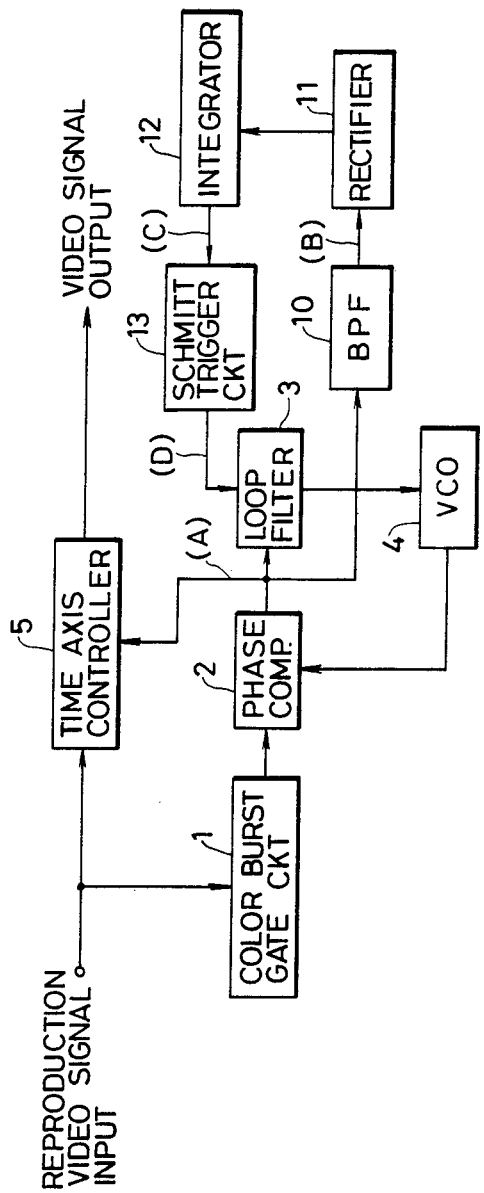
FIG. 3 is a block diagram showing a time axis correcting device in a VDP to which a PLL circuit synchronous/asynchronous state detecting circuit according to one embodiment of this invention is applied.

FIG. 3 shows a reproduction signal time axis correcting circuit to which one embodiment of the invention is applied. In FIG. 3, parts corresponding functionally to those which have been described with reference to FIG. 1 are designated by corresponding reference numerals or characters. The comparison output (A) of the phase comparator in the PLL circuit is applied to a BPF (bandpass filter) 10, so that a particular frequency component is extracted. The extraction output (B) is subjected to full-wave rectification by a rectifier 11 and is then applied to an integrator 12. The integration output (C) of the integrator 12 is applied to a Schmitt trigger circuit 13, the output (D) of which controls the time constant of the loop filter 3. The remainder of the circuit is similar to that in FIG. 1.

FIGS. 4A–4D are waveform diagrams for a description of the operation of the circuit in FIG. 3. FIGS. 4A–4D show the signals (A) through (D), respectively, in FIG. 3. It is assumed that, when the reproducing device, or the VDP, is started, the output (D) of the Schmitt trigger circuit 13 is at a low level and the loop characteristic of the PLL circuit is narrow band. Under this condition, first a reproduction color burst signal which is different by several hundred Hertz from the oscillation signal from the VCO 4 in the PLL circuit is applied to the phase comparator 2 by the actions of the tangential mirror and the spindle motor which are adapted to correct the time axis error of the VDP. Accordingly, a beat component which is the difference frequency between the two signals is included in the output (A) of the phase comparator 2. However, it should be noted that before the beat frequency component is obtained, noises occur at random for a period which is shown shaded in the left-hand area of FIG. 4A. The reason for this noise is that in practice the circuit is so designed that the comparison output (A) is obtained by sampling and holding the output of the phase comparator 2, and the comparison output becomes a noise component during the initial period in which the sample and hold pulse and the reproduction color burst cannot be accurately obtained. The noise component is greatly attenuated by the BPF 10, so that the output (B) of the BPF is substantially at the zero level.

The characteristic of the BPF 10 is set such that the BPF 10 damps a component higher than a frequency fp (where fp is the pull-in frequency when the loop characteristic of the PLL circuit is wide band) and also attenuates a 30 Hz (from 30 to 10 Hz in the case of a constant linear velocity (CLV) record disk system) component which results from the eccentricity of the record disk. The lower cut-off frequency of the BPF 10 is the eccentricity component of the record disk, since the cut-off frequency of the PLL will be set to a value lower than the eccentricity component.

Figure 4A:
FIGS. 4A–4D and 5A–5B are waveform diagrams for a description of the operation of the circuit of FIG. 3.
Figure 4B:
Figure 4C:
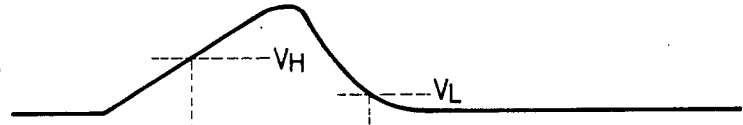
Figure 4D:

As the speed of the spindle motor reaches a predetermined value, the phase comparator 2 provides the beat frequency component as shown in FIG. 4A. The beat frequency is selectively extracted by the BPF having the above-described characteristic, as a result of which a sine wave signal as shown in FIG. 4B is obtained. This signal will result in an integration waveform as shown in FIG. 4C after passing through the rectifier 11 and the integrator 12. When the integration waveform reaches a high threshold value $V_H$ set in the Schmitt trigger circuit 13, the output (D) of the circuit 13 is raised to the high level, and the time constant of the loop filter 3 is lowered. That is, the loop characteristic is switched over to a wide band characteristic having a cut-off frequency fp. Accordingly, the follow-up characteristic of the PLL is improved, and the lock-in operation is readily achieved.

When the PLL circuit is placed in the synchronous state, the beat component disappears from the output (A) of the phase comparator 2. Therefore, the integration output is gradually decreased as indicated in FIG. 4C. When the output reaches the low threshold value $V_L$ of the Schmitt trigger circuit 13, the output (D) is set to the low level and the time constant of the loop filter 3 is increased. Accordingly, the loop characteristic is switched over to narrow band, and the PLL circuit is stably operated.

In this synchronous state, a low frequency beat component of 30 Hz or less due to record disk eccentricity appears in the output (A) of the phase comparator. However, this component is not detected because the BPF 10 attenuates this component. In addition, even when noises occur due to drop-out, they are damped by the BPF 10. Accordingly, the previous problem that such a single noisy error input could be mistaken for the asynchronous state of the PLL is eliminated.

Figure 5A:
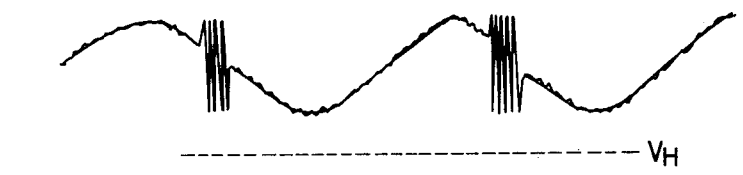
Figure 5B:

FIGS. 5A and 5B show the output of the phase comparator 2 and the output of the integrator 12, respectively, when the VDP is in a so-called "CAV scan operation mode". The term "scan operation" indicates an operation in which the searching of a picture is carried out by quickly forwarding the pickup data detecting point perpendicularly to the track with the tracking servo and the tangential servo loop being active. When, in this operation, the swing angle of the tracking mirror reaches a limit value, the tracking servo loop is inactivated so that the mirror will be returned to the central position in the swing angle, and the quick forwarding operation is carried out with the tracking servo loop being made active again.

The above-described operation is repeatedly carried out. During a period of several tens of milli-seconds (ms) for which the tracking servo loop is off (inactive), a beat component or noise component appears in the output of the phase comparator 2 as shown in FIG. 5A. However, since the duration of this beat component is short, the output of the integrator 12 will not reach the high threshold value $V_H$ of the Schmitt trigger circuit 13. Accordingly, the loop band characteristic is not changed, i.e., the narrow band characteristic is maintained. In the CAV scan mode, owing to the recording characteristic of the CAV disk system, the time axis of the reproduction signal is maintained normal and the PLL circuit is held in the synchronous state, and accordingly the switching of the loop characteristic is not required. Thus, the circuit in FIG. 3 is suitable for the CAV scan mode.

In a CLV disk system, whenever the tracking servo loop is disabled in the scan mode, the time axis of the reproduction signal is made greatly irregular so that the PLL circuit is placed in an asynchronous state. As a result, the beat component appears in the phase comparison output and the state of the Schmitt trigger circuit is changed, so that band control is carried out and the lock-in operation is readily achieved.

There is a time lag between the time instant the PLL circuit is placed in the synchronous state and the time instant the output (C) of the integrator 12 reaches the low threshold value $V_L$ of the Schmitt trigger circuit. During this period the PLL circuit assumes completely stable synchronization.

As is apparent from the above description, the circuit of the invention, being simple in arrangement, can detect the synchronous state of the PLL circuit. Therefore, the circuit of the invention is applicable to a reproduction signal time axis error detecting device and especially to a VDP time axis correcting device.

Although the present invention has been described with respect to specific embodiments, it will be appreciated by one skilled in the art that a variety of changes may be made without departing from the scope of the invention. For example, certain features may be used independently of others and equivalents may be substituted all within the spirit and scope of the invention. Specifically, the PLL circuit according to the invention is applicable not only to the time axis control for the VDP but also to the other controls. Furthermore, the synchnous state detection signal of the PLL circuit is applicable not only to the change of the loop filter characteristic but also to the control of other elements.

What is claimed is:

1. A detection circuit for detecting synchronous and asynchronous states is a phase-locked loop (PLL) circuit, said PLL circuit including a voltage controlled oscillator for generating an oscillation signal, a phase comparator for comparing said oscillation signal to an input signal, said phase comparator providing an output which includes a first frequency component when said PLL circuit is in said synchronous state and a second frequency component when said PLL circuit is in an asynchronous state, and a loop filter connected between said phase comparator and said voltage controlled oscillator for providing a control signal applied to said voltage controlled oscillator, said detection circuit comprising:

processing means for generating a processed signal from said phase comparator output by removing said first frequency component from said phase comparator output; and detection signal generating means responsive to said processed signal for generating a detection signal indicating the synchronous or asynchronous state of said PLL circuit.

2. A detection circuit as claimed in claim 1, wherein said PLL circuit is part of a reproduction signal time axis error correcting device and said input signal is a particular frequency component contained in said reproduction signal.

3. A detection circuit as claimed in claim 1, wherein said detection signal generating means comprises:

integrating means for integrating said processed signal to provide an integration signal;

level decision means for generating said detection signal in accordance with the level of said integration signal.

4. A detection signal circuit as claimed in claim 1, wherein said detection signal generating means comprises:

rectifying means for receiving and rectifying said processed signal;

integrating means for receiving and integrating the output of said rectifying means to provide an integration signal; and level decision means for generating said detection signal in accordance with the level of said integration signal.

5. A detection circuit as claimed in claim 4, wherein said level decision means generates as said detection signal an asynchronous indication signal representing an asynchronous state of said PLL circuit when said integration signal exceeds a first predetermined value.

6. A detection circuit as claimed in claim 5, wherein said level decision means terminates said asynchronous indication signal when said integration signal falls below a second predetermined level lower than said first predetermined level.

7. A detection circuit as claimed in claim 1, wherein said processing means comprises a bandpass filter having a lower cut-off frequency higher than said first frequency.

8. A detection circuit as claimed in claim 1, wherein said detection signal generated by said level decision means varies a time constant of said loop filter.

9. A detection circuit as claimed in claim 1, wherein said PLL circuit is a part of a reproduction signal time axis error correcting device for a disk-type player, said first frequency component comprising at least a part of said reproduction signal which results from the eccentricity of the disk.

10. A detection circuit for detecting synchronous and asynchronous states in a phase-locked loop (PLL) circuit contained in a time axis error correcting device; said PLL circuit including a voltage controlled oscillator for generating an oscillation signal, a phase comparator providing an output which includes a first frequency component corresponding to a rotation frequency of said video disc when said PLL circuit is in said synchronous state and a second frequency component when said PLL circuit is in an asynchronous state, and a loop filter connected between said phase comparator and said voltage controlled oscillator for providing a control signal being applied to said voltage controlled oscillator; said detection circuit comprising:

a bandpass filter for extracting said second frequency component from said output signal of said phase comparator;

rectifying means for rectifying said second frequency component provided by said bandpass filter to provide a rectified signal;

integration means for integrating said rectified signal and providing an integration signal; and level decision means for generating a detection signal indicating the synchronous or asynchronous state of said PLL circuit by comparing said integration signal with a predetermined level.

11. A detection circuit as claimed in claim 10, wherein said level decision means comprises a Schmitt trigger cicuit.

12. A detection circuit as claimed in claim 10, wherein said level decision means generates as said detection signal an asynchronous indication signal representing an asynchronous state of said PLL circuit when said integration signal exceeds a first predetermined value.

13. A detection circuit as claimed in claim 12, wherein said level decision means terminates said asynchronous indication signal when said integration signal falls below a second predetermined level lower than said first predetermined level.

14. A detection circuit as claimed in claim 10, wherein said detection signal generated by said level decision means varies a time constant of said loop filter.

* * * * *